US011328935B2

(12) United States Patent
Gatterbauer et al.

(10) Patent No.: US 11,328,935 B2
(45) Date of Patent: May 10, 2022

(54) METHOD OF FORMING A LAYER STRUCTURE, LAYER STRUCTURE, METHOD OF FORMING A CONTACT STRUCTURE, METHOD OF FORMING A CHIP PACKAGE, AND CHIP PACKAGE

(71) Applicant: Infineon Technologies AG, Neubiberg (DE)

(72) Inventors: Johann Gatterbauer, Parsberg (DE); Wolfgang Lehnert, Lintach (DE); Norbert Mais, Munich (DE); Verena Muhr, Regensburg (DE); Edmund Riedl, Wald (DE); Harry Sax, Straubing (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/743,571

(22) Filed: Jan. 15, 2020

(65) Prior Publication Data

US 2020/0227278 A1    Jul. 16, 2020

(30) Foreign Application Priority Data

Jan. 16, 2019   (DE) .......................... 102019101061.6

(51) Int. Cl.
| | |
|---|---|
| *H01L 21/48* | (2006.01) |
| *H01L 21/02* | (2006.01) |
| *H01L 21/56* | (2006.01) |
| *H01L 23/31* | (2006.01) |
| *H01L 23/495* | (2006.01) |
| *C23C 14/12* | (2006.01) |

(52) U.S. Cl.
CPC .......... *H01L 21/4825* (2013.01); *C23C 14/12* (2013.01); *H01L 21/02118* (2013.01); *H01L 21/02178* (2013.01); *H01L 21/56* (2013.01); *H01L 23/3121* (2013.01); *H01L 23/49586* (2013.01)

(58) Field of Classification Search
CPC .......... H01L 21/02304; H01L 21/4825; H01L 21/4821
See application file for complete search history.

(56) References Cited

U.S. PATENT DOCUMENTS

| | | | |
|---|---|---|---|
| 5,312,529 A | 5/1994 | Antonelli et al. | |
| 6,580,170 B2 | 6/2003 | Swanson et al. | |
| 8,187,964 B2 | 5/2012 | Mahler et al. | |
| 2001/0020066 A1* | 9/2001 | Sasaki | C09D 5/08 525/100 |
| 2005/0158528 A1* | 7/2005 | Sasaki | H05K 3/1208 428/209 |

(Continued)

FOREIGN PATENT DOCUMENTS

| | | |
|---|---|---|
| DE | 19748240 A1 | 5/1999 |
| DE | 102007022621 A1 | 11/2008 |
| JP | 2015133401 A | 7/2015 |

*Primary Examiner* — Joseph A Miller, Jr.
(74) *Attorney, Agent, or Firm* — Murphy, Bilak & Homiller, PLLC

(57) ABSTRACT

A method of forming a layer structure is provided. The method may include plasma-treating a metal surface with a hydrogen-containing plasma, thereby forming nucleophilic groups over the metal surface, and forming an organic layer over the metal surface, wherein the organic layer comprises silane and is covalently bonded to the nucleophilic groups.

15 Claims, 13 Drawing Sheets

(56) References Cited

U.S. PATENT DOCUMENTS

| | | | |
|---|---|---|---|
| 2006/0205237 A1* | 9/2006 | Kodama | C09D 183/06 438/790 |
| 2007/0065578 A1 | 3/2007 | McDougall | |
| 2014/0342575 A1 | 11/2014 | Ito et al. | |
| 2017/0338169 A1 | 11/2017 | Mahler et al. | |
| 2019/0016903 A1* | 1/2019 | Wong | C09D 183/04 |

* cited by examiner

FIG. 1

TABLE 4

| No | Name | Structure | Electrophil or group for metal linkage |
|---|---|---|---|
| 1 | N-(2-Aminoethyl)-3-aminopropyltrimethoxysilane (CAS: 1760-24-3) | | Tri-methoxy-silane |
| 2 | (3-Trimethoxysilylpropyl) diethylenetriamine (CAS: 35141-30-1) | | Tri-methoxy-silane |
| 3 | Cycloamin-silan 2,2-Dimethoxy-1,6-diaza-2-silacyclooctane (CAS: 182008-07-7) | | Tri-methoxy-silane |
| 4 | Aminopropyltriethoxysilan (CAS: 919-30-2) | | Tri-ethoxy-silane |
| 5 | Aminopropyltrimethoxysilan (CAS: 13822-56-5) | | Tri-methoxy-silane |
| 6 | (Aminoethylaminomethyl) Phenethyltrimethoxysilane (CAS: 74113-77-2) | | Tri-methoxy-silane |
| 7 | Bis(triethoxysilylpropyl)amine (CAS: 13497-18-2) | | Tri-ethoxy-silane |
| 8 | Bis(trimethoxysilylpropyl)amine (CAS: 82985-35-1) | | Tri-methoxy-silane |
| 9 | N,N'-Bis(3-(trimethoxysilyl)propyl)ethylenediamine (CAS: 68845-16-9) | | Tri-methoxy-silane |
| 10 | Bis(triethoxysilyl)ethane (CAS: 16068-37-4) | | Tri-ethoxy-silane |
| 11 | 3-Amino-5-mercapto-1,2,4-triazole (CAS: 16691-43-3) | | Thio |

TABLE 4 (continued)

| No | Name | Structure | Electrophil or group for metal linkage |
|---|---|---|---|
| 12 | 3-Mercaptopropyltrimethoxysilane (CAS: 4420-74-0) |  | Tri-methoxy-silane |
| 13 | 3-Mercaptopropyltriethoxysilane (CAS: 14814-09-6) |  | Tri-ethoxy-silane |

METHOD OF FORMING A LAYER STRUCTURE, LAYER STRUCTURE, METHOD OF FORMING A CONTACT STRUCTURE, METHOD OF FORMING A CHIP PACKAGE, AND CHIP PACKAGE

TECHNICAL FIELD

Various embodiments relate generally to a method of forming a layer structure, a layer structure, a method of forming a contact structure, a method of forming a chip package, and a chip package.

BACKGROUND

A chip package is supposed to be robust, which may include a reliable protection from adverse influence from the outside, and also from corrosive substances that may be present or forming within the chip package.

This means that two functions should be provided by an interface between an encapsulation material and a device (the device may in this case be a combination of a chip and a substrate (e.g. a leadframe or a ceramic substrate)): An adhesion promoting interface and a corrosion barrier to protect against $H_2O$, $O_2$, or any other corrosive gases ($H_2S$, organic sulfur molecules such as thioles, etc.).

In plastic packages, a galvanic process (for example a treatment referred to as A2-treatment) may be used to grow Cr/Zn-dendrites to enable a "mechanical" adhesion of a molding compound. This process provides both, a corrosion protection and an adhesion function. However, the process is complicated.

SUMMARY

A method of forming a layer structure is provided. The method may include plasma-treating a metal surface with a hydrogen-containing plasma, thereby forming nucleophilic groups over the metal surface, and forming an organic layer over the metal surface, wherein the organic layer comprises or consists of silane and is covalently bonded to the nucleophilic groups.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

Figure 1:
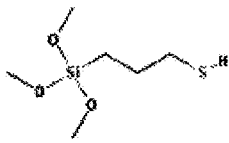
FIG. 1 shows a table of organic materials used in various embodiments.
Figure 1:
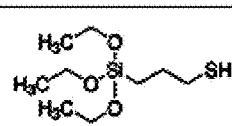

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

Bifunctional silane molecules 338 may act as adhesion promoters. To allow for an adhesion promotion between a metal surface and a packaging material, it may be necessary to bond the silane molecules to the metal surface, a process that may be referred to as silanization. The silanization process may require a presence of OH-groups or any other nucleophilic group (—$NH_2$, —CN) on the metal surface 330S. For base metals, at least some OH-groups may be formed, because the base metals may form native oxides that may lead to hydroxylation in humid air, like for example with aluminum oxide. However, applying silanes to precious metals (e.g. Ag, Au) may generate some issues, because those metals do not form a hydroxyl-terminated surface, but may rather form weaker amino-complex bonds with aminosilanes or form thioles with thiosilanes. Thiosilanes as adhesion promoter molecule instead of aminosilanes may however not be used, due to the known issue of sulfur inducing corrosion in packages.

Therefore, present layer structures may suffer from delamination under reliability condition testing (e.g. high temperature storing, e.g. HTS1000h at 175° C. or thermal cycling, e.g. TC1000 from −55 . . . 150° C.) with a high risk of electrical fails especially on precious metal surfaces, because on the precious metal surfaces, a proper silane coupling may not be possible.

In various embodiments, for technology simplification, an adhesion promoter technology that represents an alternative to the known technology, is described herein.

In various embodiments, a layer structure and a method of forming the layer structure are provided. The layer structure may include an adhesion promoter layer and a corrosion prevention layer, also referred to as corrosion barrier. The adhesion promoter layer and the corrosion prevention layer may not necessarily be provided as two separate layers. In various embodiments, a single layer may provide both funtions. The adhesion promoter may promote an adhesion between a metal surface and a packaging material. The adhesion promotion function may at least partially be based on nucleophilic groups formed on or over the metal surface. An organic material may be covalently bonded to the nucleophilic groups and may itself provide on its surface reaction partners, e.g. nucleophilic groups, for bonding with an encapsulation material. In various embodiments, processes for forming the nucleophilic groups on or over the metal surface and/or the organic material may be selected in such a way that a particularly strong bonding is obtained, while at the same time, the corrosion barrier functionality is provided.

In various embodiments, the forming of the nucleophilic groups may include a forming of an oxide layer on the metal surface using atomic layer deposition (ALD), and/or a treating of the metal surface or of a surface of the oxide layer with a hydrogen-containing plasma.

In various embodiments, the organic material may include or consist of a silane or 3-Amino-5-mercapto-1,2,4-triazole, or a mixture of such materials.

In various embodiments, the method may include plasmaconditioning and silane molecule deposition forming a poly-organic siloxane layer that offers nucleophilic groups towards the polymer attached to this layer. The polymer may for example be a mold compound, silicone, or other polymer that is attached through the nucleophilic groups.

In various embodiments, aluminum oxide ($Al_2O_3$) may be deposited on a device surface by atomic layer deoposition (ALD) before the silane molecule deposistion. The aluminum oxide may act as a chemically homogeneous adhesion promoter surface for the device surface, for example even in a case of the device including not only metals (e.g precious and/or non-precious metals), but also ceramics and/or polymers (e.g. polyimide on chip). Bifunctional silane molecules may be used for the silane molecule deposition.

In various embodiments, the ALD aluminum oxide ($Al_2O_3$) layer used as adhesion promoter may be treated with a plasma for surface group optimization for the subsequent silane layer deposition. Thereby, a further increase of surface reaction yield regarding surface coupling may be achieved.

Figure 2:
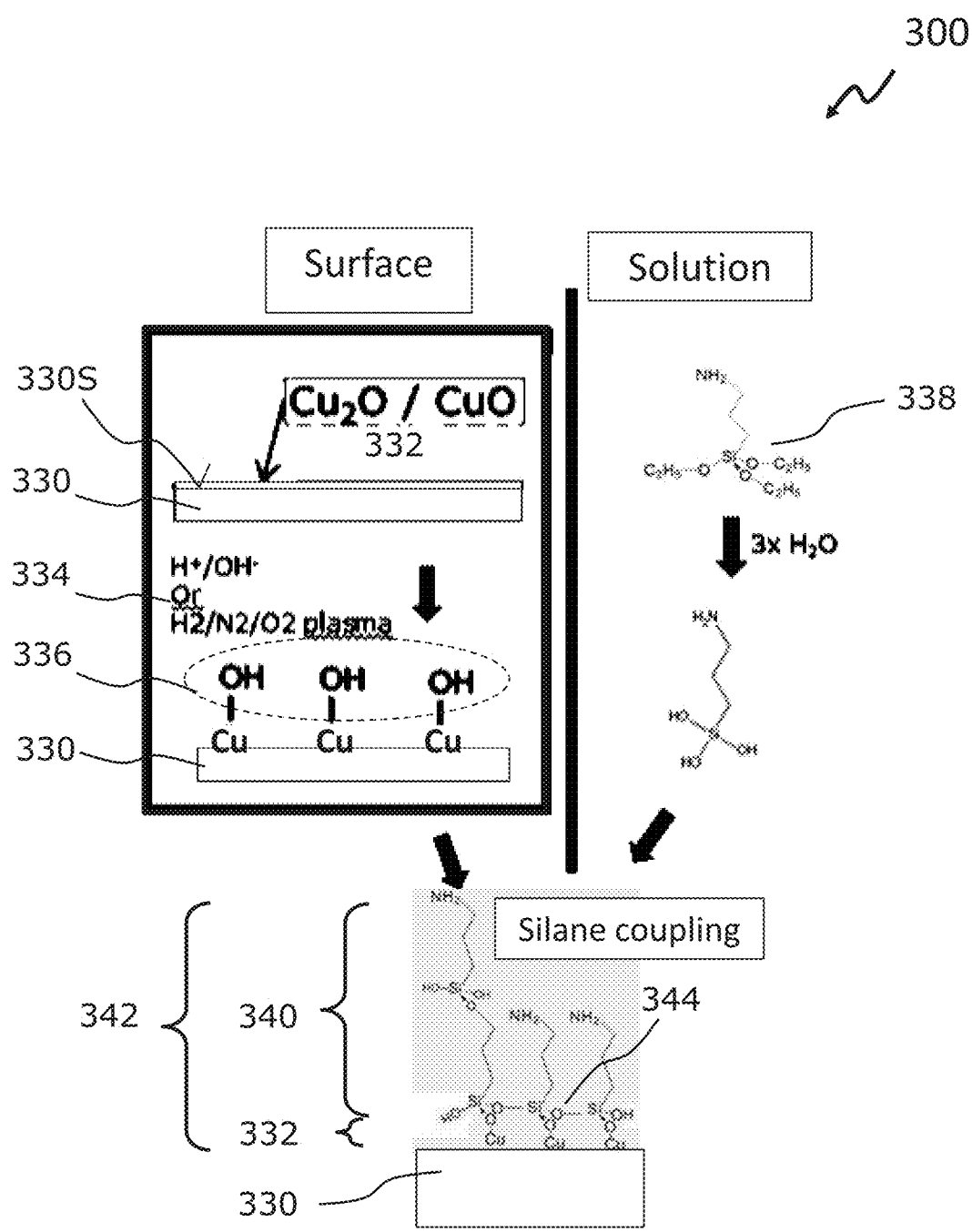
FIG. 2 shows a schematic visualization of a process of forming a layer structure in accordance with various embodiments.
Figure 3:
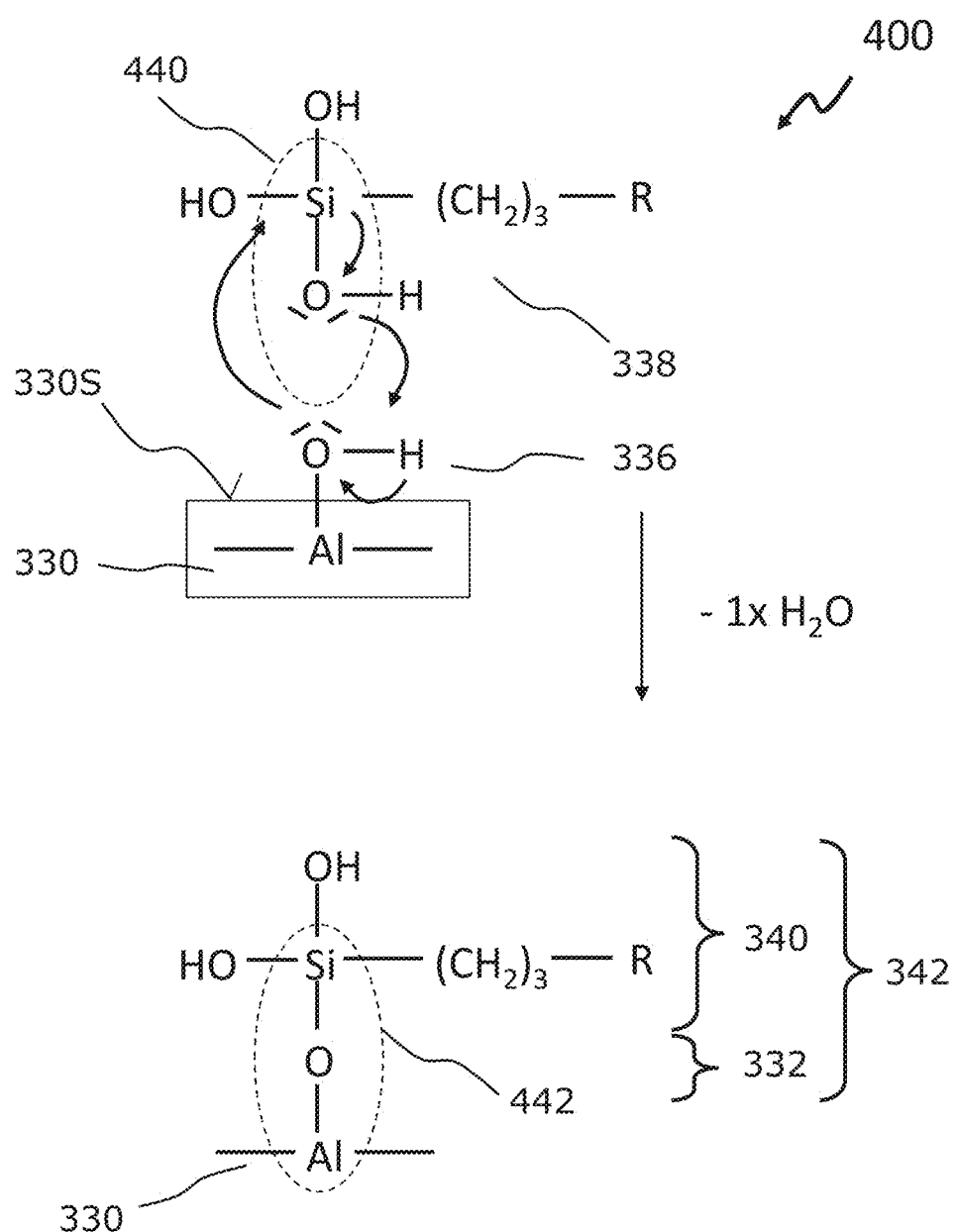
FIG. 3 shows a schematic visualization of a nucleophilic substitution reaction in accordance with various embodiments.
Figure 4:
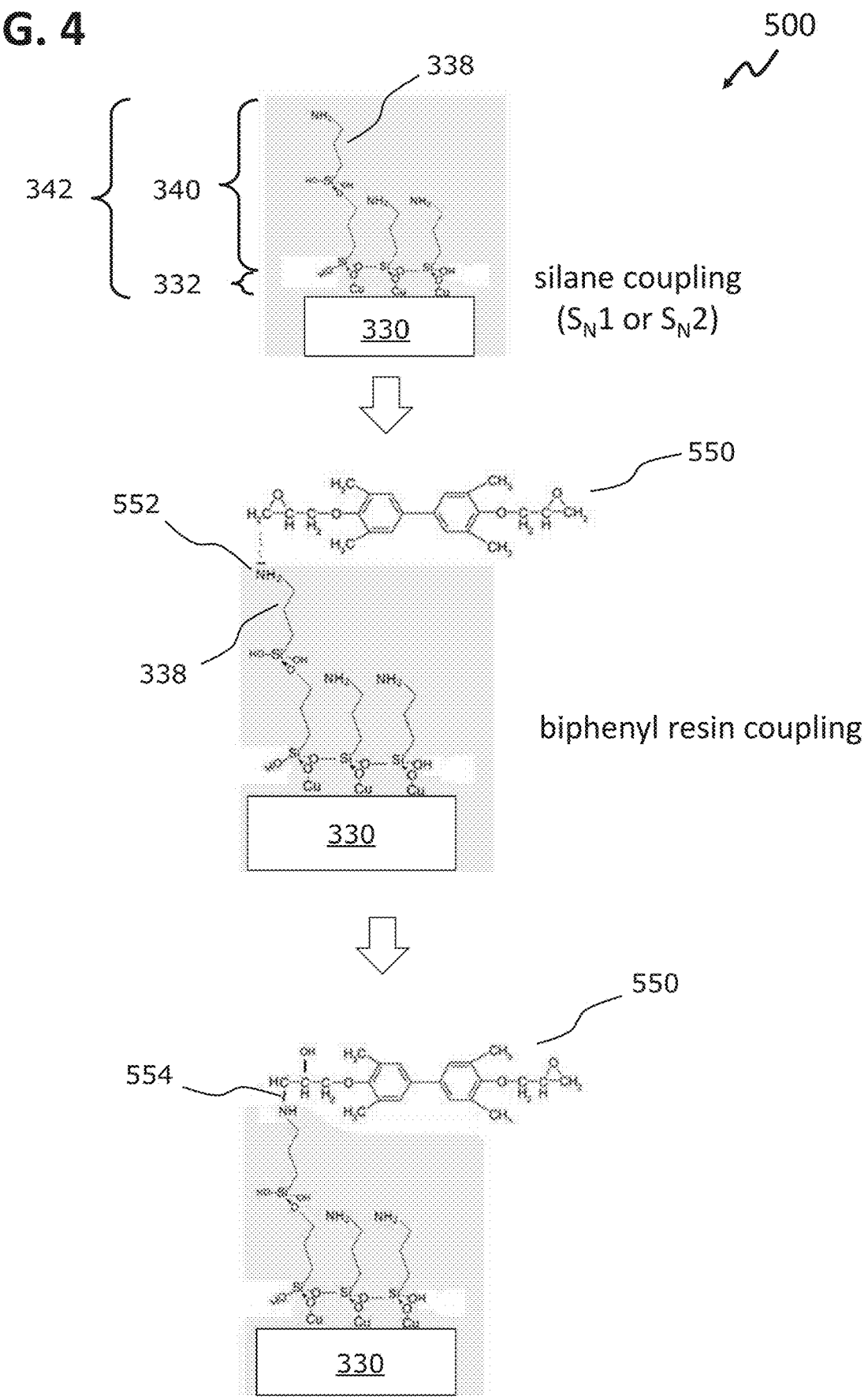
FIG. 4 shows a schematic visualization of a nucleophilic substitution reaction and of a resin coupling, each in accordance with various embodiments.
Figure 5A:
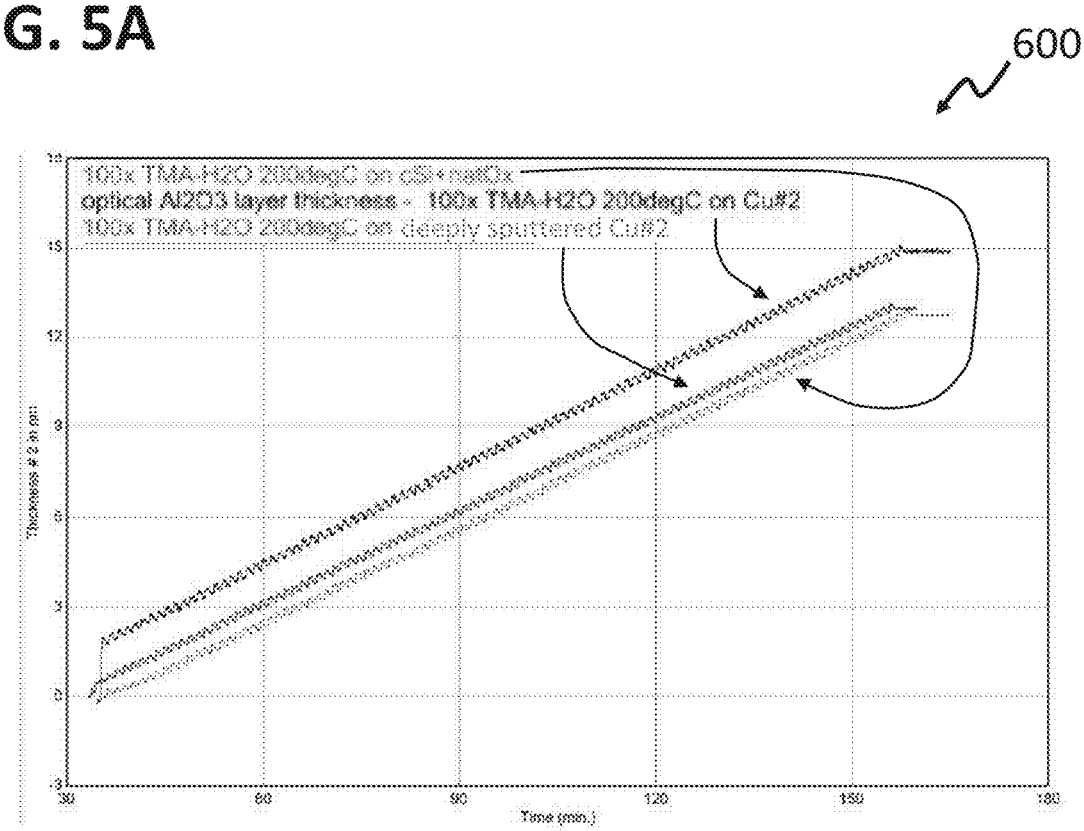
FIG. 5A and FIG. 5B show graphic visualizations of oxide layer growth in accordance with various embodiments.
Figure 5B:
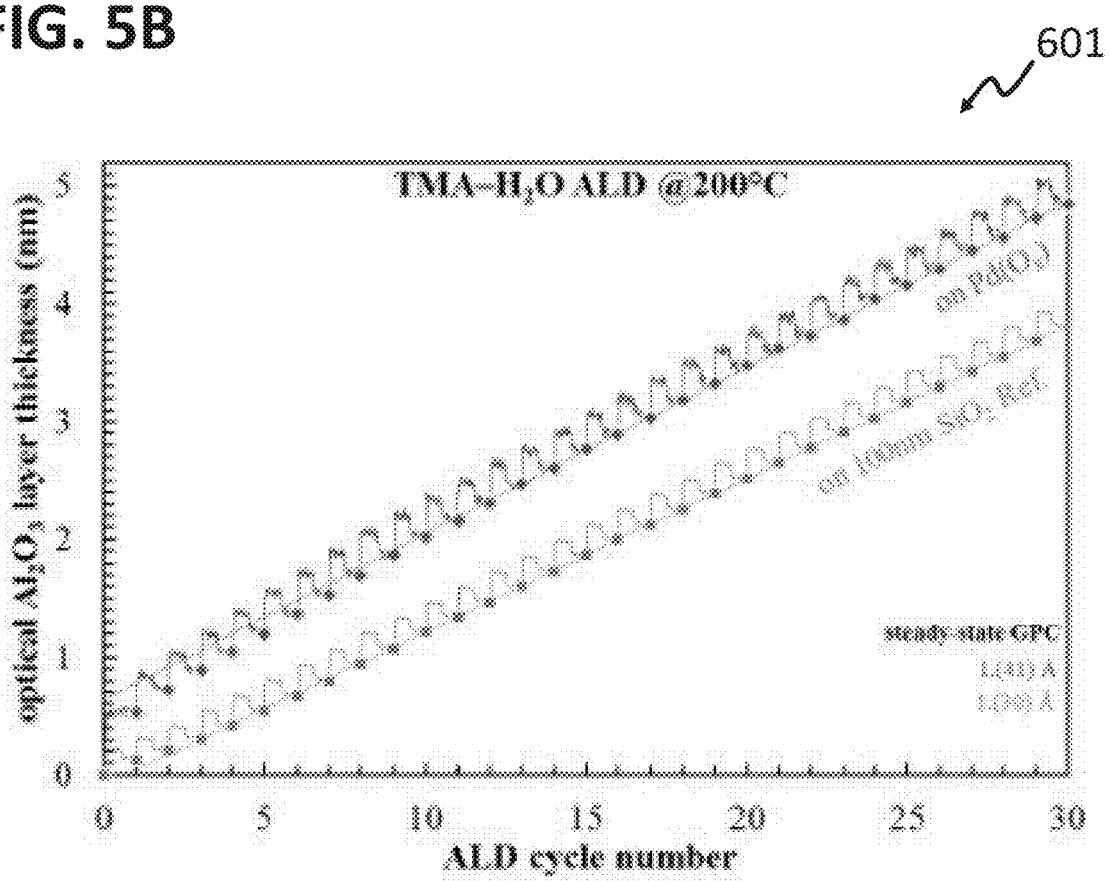
Figure 5C:
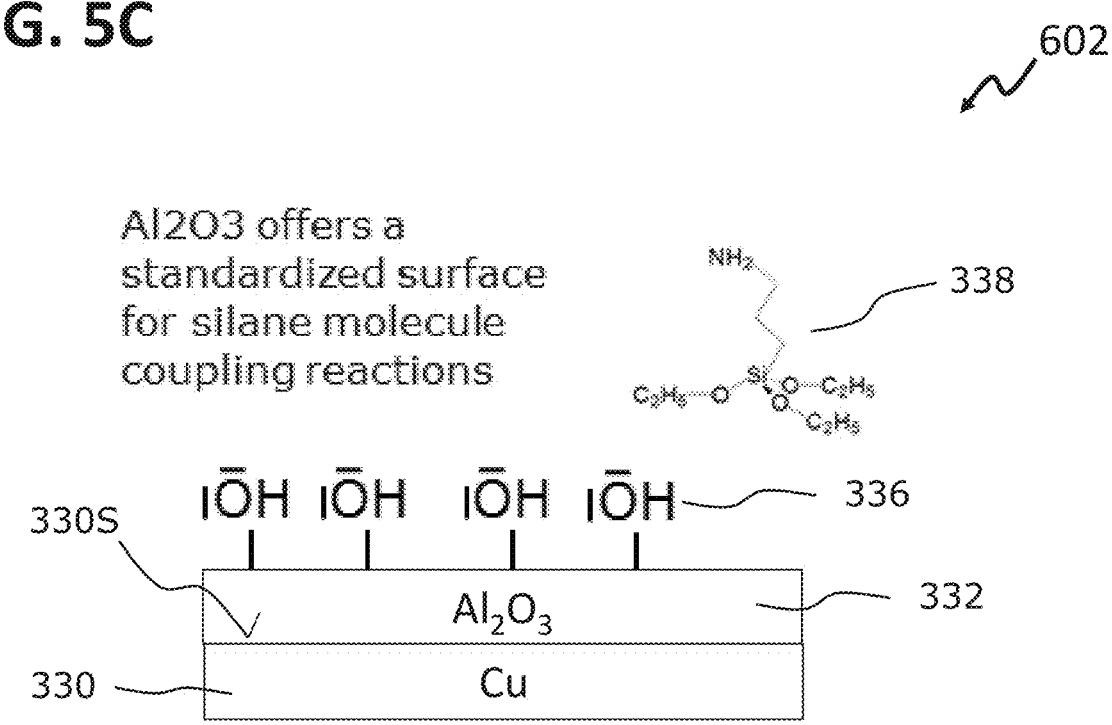
FIG. 5C shows a schematic representation of the surface formed by the oxide layer growth of FIG. 5A or FIG. 5B, respectively.

FIG. 2 shows a schematic visualization 300 of processes that are part of a method of forming a layer structure 342 in accordance with various embodiments. FIG. 3 shows a schematic visualization of a nucleophilic substitution reaction in accordance with various embodiments, FIG. 4 shows a schematic visualization of a nucleophilic substitution reaction and of a resin coupling, each in accordance with various embodiments, FIG. 5A and FIG. 5B show graphic visualizations 600, 601 of oxide layer growth using atomic layer deposition in accordance with various embodiments, and FIG. 5C shows a schematic representation of the surface formed by the oxide layer growth of FIG. 5A or FIG. 5B, respectively.

In various embodiments, a metal surface 330S may be provided, which may be part of a metal structure 330. The metal structure 330 may consist of or essentially consist of metal. It may for example be a metal lead frame or a different kind of metal contact structure, e.g. a metal clip, a metal wire, a chip contact of a chip, or a different type of metal structure. In various embodiments, the metal structure 330 may be a multi-part metal structure 330, for example a bonding wire bonded to a lead frame, a bonding wire bonded to a chip contact of a chip, a metal clip attached to a metal contact surface, or the like.

The metal may include or consist of aluminum (Al), tantalum (Ta), lead (Pb), tin (Sn), nickel (Ni), nickel phosphorus alloy (NiP), titanium (Ti), copper (Cu), gold (Au), silver (Ag), platinum (Pt), palladium (Pd) or other metals or metal alloys. The metal surface 330S may be formed by one or more metals, for example of the metals listed above. The metal structure 330 may consist of or essentially consist of only one type of metal, or of more than one metal, for example in a metal alloy, as a plated or layered metal structure 330, and/or as the multi-part metal structure, wherein the different parts include or consist of different metals, for example a gold bonding wire bonded to a copper leadframe, or the like.

In various embodiments, the metal structure 330 may be part of a device in which the metal structure 330 is combined with non-metallic material, for example a semiconductor material or an electrically insulating material. For example, the metal structure 330 may be a chip contact included in a semiconductor chip. In the device, not only the metal surface 330S may be provided, but also a non-metallic outer surface portion, e.g. a semiconductor surface, e.g. a silicon (Si) or germanium (Ge) surface portion or the like, and/or an insulating surface portion, for example a surface of a passivation layer on the semiconductor chip, e.g. silicon oxide, silicon nitride, or the like. The non-metallic outer surface portion may in various embodiments be adjacent to the metal surface 330S. For example, an outer surface of the device may be formed by a combination of the metal surface 330S, the non-metallic outer surface portion, and possibly, but not necessarily, further metallic or non-metallic surface portions.

The method may include forming nucleophilic groups 336 attached to the metal surface 330S. The nucleophilic groups 336 may for example include or consist of —OH-groups (as shown in FIG. 2, FIG. 3, FIG. 4 and FIG. 5C), —$NH_2$-groups, and/or —CN-groups.

In the case of the non-metallic outer surface portion being present, the nucleophilic groups may include a first portion of nucleophilic groups attached to the metal surface that is formed simultaneously with a second portion of nucleophilic groups attached to the non-metal surface.

The forming the nucleophilic groups 336 may in various embodiments include or consist of plasma treating the metal surface 330S with a plasma 334, e.g. a hydrogen-containing plasma.

In various embodiments, the forming the nucleophilic groups 336 may include or consist of forming an oxide layer 332 over, e.g. on, the metal surface 330S, for example by atomic layer deposition. This is shown in FIG. 2 for an exemplary copper metal surface 330S, on which a copper oxide (copper (I) oxide and/or copper (II) oxide) is formed, and in FIG. 5C for a copper metal surface 330S, on which an aluminum oxide ($Al_2O_3$) layer 332 is formed. In the exemplary embodiments shown in FIG. 3 and FIG. 4, an oxide layer 332 may or may not have been present. The situation shown in FIG. 3 and FIG. 4 may have been obtained through both scenarios, either by creating the nucleophilic groups 336 (OH groups in the embodiments) on the pure metal surfaces 330S by the plasma processing, or by removing the oxide layer 332 until only the nucleophilic groups 336, e.g. a layer of nucleophilic groups 336 (OH groups in the embodiments) remain on the metal surface 330S.

The oxide (e.g. aluminum oxide) layer 332 may be deposited on the complete device surface, i.e. on the metal surface 330S and possibly, if present, on non-metal surfaces of the device (including any ceramics and polymers such as polyimide on chip). This may provide a chemically homogeneous surface of aluminum oxide, which may allow an easy formation of hydroxo-groups on the surface that may enable a coupling reaction of the silane function to the surface to a much bigger extent. A surface concentration of OH-groups on natural aluminium oxide may already be at about 50% of the surface area.

In various embodiments, the metal surface 330S, in particular the precious metal device surface 330S, may be ALD coated with an oxide, e.g. aluminum oxide, silicon oxide, zirconium oxide, titanium oxide, tantalum oxide, or mixtures thereof. Therefore, a metal surface 330S including or consisting of a hydroxide, e.g. a metal hydroxide, e.g. aluminum hydroxide, may be offered to the respective silane molecules 338. Only the nucleophilic substitution of the (e.g. metal) hydroxide with the silane group will happen, no unfavourable side reactions can occur such as a complexation with the amino group, because the amino group is known to form weaker chemical bonds.

Thereby, a standardized surface for an optimized silane coupling may be provided.

The ALD coating may be performed as a batch ALD process or as a spatial ALD process.

Using silicon oxide ALD may have an advantage in that the surface finish with Si-groups (in other words, the forming of the organic layer 340 that may be covalently bonded to the the nucleophilic groups 336) can be done in situ by the ALD process. Typical Si precursors for ALD may be aminosilanes (e.g. tris[dimethylamino]silane (3DMAS), N-(diethylaminosilyl)-N-ethylethanamine (SAM24), or Bis(t-butylamino)silane (BTBAS).

In FIG. 5A and FIG. 5B, a few details on the ALD deposition process and conditions are shown.

For Atomic Layer Deposition (ALD) based on TMA and $H_2O$-precursor (AlOx), it is known to establish a surface with OH-groups.

In the graphs, a relationship between layer thickness (y-axis, in nm) and cycle number or time, respectively, on the x-axis, are shown. Depending on a substrate there may be linear growth (e.g. for CuO, middle and top line in FIG. 5A) or even an increased growth rate (e.g. electroless deposited Ni/Pd on wafer level, FIG. 5B, top line) for the aluminum oxide.

Furthermore, the deposition may work quite well on most metals, but may also work on polymers like polyimide, which may be part of the chip surface.

The ALD may for example be applied either to an incoming leadframe (e.g. to use oxidation protection properties for Cu-wirebond when forming the second bond) or later in the process. Due to a low process temperature (e.g. 200° C.), it may be possible to do so after die attach or wire bonding. In other words, in various embodiments, a method of forming a contact structure may be provided, which may include forming a layer structure in accordance with various embodiments as described herein, and, before or after the forming the nucleophilic groups 336, forming an electrical contact to the metal surface 330S.

This means that, in various embodiments, the layer structure 342 providing the adhesion promoter and corrosion barrier functions may be formed after some (e.g. all) electrical contacts are in place, such that it may not be necessary to damage the layer structure 342 before the packaging.

In various embodiments, the oxide layer 332 may already include nucleophilic groups 336 at their surface after the forming, e.g. depositing or spontaneous forming, of the oxide layer 332. These nucleophilic groups 336 may form as part or result of a metal surface 330S forming or treatment process (e.g. in a case of the metal surface 330S including or consisting of a base metal) or as part of the oxide layer 332 deposition process.

The following Table 1 gives an overview over a surface composition for a number of metal surfaces 330S provided by respective metal substrates. In a case of the substrate forming a layer stack, the top layer is specified last. Measurements were obtained using x-ray photoelectron spectroscopy, and a percentage of OH groups (fraction of the surface area of the respective metal surface covered by OH groups) is given in parentheses.

| Substrates | XPS: Surface scan on metal oxides and hydroxide |
|---|---|
| Cu K80 (Cu—0.15Fe—0.02P) cleaned | CuO, $Cu_2O$, Cu—OH (23%) |
| Ni (2 μm)/NiP (<100 nm) galvanic | NiO, Ni—OH (27%) |
| Ni galvanic (2 μm) | NiO, Ni—OH (21%) |
| Ni/NiP/Pd/Au galvanic (2 μm/100 nm/30-60 nm/50-80 nm) | Au with Ni and Pd traces |
| Al pure | $Al_2O_3$, Al—OH (50%) |
| Ag sputtered (Cu/1 μm NiV/4 μm Ag: only frontside) | Ag with sulfur traces |
| e-less Ag (Cu/0.1-0.3 μm Ag) | Ag with chlorine traces |

As can be seen, the base metal surfaces (i.e., the metal surfaces 330S including or consisting base metals, in this case copper, nickel and aluminum, respectively) have formed metal oxides and also metal hydroxides at their respective surfaces. A surface fraction covered by the metal hydroxides is between 21% for a galvanic nickel surface and 50% for a pure aluminum surface. None of the precious metals has formed an oxide layer 332 and/or a metal hydroxide at their respective surfaces.

In various embodiments, the nucleophilic groups 336 (in other words, all or essentially all the nucleophilic groups 336) or further nucleophilic groups 336 in addition to the spontaneously formed nucleophilic groups 336 may be formed by plasma treating the metal surface 330S or the oxide layer 332, respectively, with the (e.g. hydrogen-containing) plasma 334. In any case, a surface fraction covered by nucleophilic groups may be increased by the plasma 334 treatment.

On the precious metals, in various embodiments, the oxide layer 332, e.g. an aluminum oxide layer, may be formed. Optionally, the oxide layer 332 formed over the precious metal may subsequently be plasma treated.

In various embodiments, the plasma 334 conditioning may first lead to a removal of any organic contamination (e.g. benzotriazole, aliphatics) and secondly to an optimum surface, e.g. metal surface 330S or, more generally, device surface, with nucleophilic groups (—OH, —$NH_2$, —CN), which may enable an optimum coupling of the organic, e.g. silane, molecule(s) 338 to form a layer structure 342, in this case a poly-organo-siloxane layer. The the layer structure 342 may be formed by an organic layer 340 formed by the organic molecules 338 and the nucleophilic groups 336, which may also form a layer. If present, the oxide layer 332 may also be part of the layer structure 342. The layer structure 342 may be several nanometers thick. The organic layer 340 may, depending, amongst other factors, on the molecules forming the organic layer 340, have a thickness in a range from about 0.5 nm to about 500 nm or more, e.g. from about 1 nm to about 300 nm, e.g. from about 5 nm to about 100 nm. The adhesion promotion may already be achieved with thin layers of about 0.5 nm to 10 nm, e.g. 1 nm to 10 nm. However, additional barrier properties may only be achieved with thicker layers of about 10 nm up to about 500 nm, depending on the bifunctional (organic) molecule 338.

In other words, with thicknesses of about 10 nm to 500 nm (or more), the organic layer 340 may have corrosion barrier properties. In a case of the oxide layer 332 being present, the organic layer 340 may be thinner than 10 nm, since the barrier function may be provided by the oxide layer. This means that, in a combination of an atomic layer deposited (ALD) oxide layer 332, e.g. an aluminum oxide layer, and the specific bifunctional organic (e.g. silane) layer 340 on the device surface, the organic (e.g. silane) layer 340 thickness may be reduced, for example down to one monolayer, which may have a thickness of about 0.5 nm or more. This may be possible, because the barrier function may be provided by the $Al_2O_3$. A thickness of the oxide layer 332 may be in a range from about 0.5 nm to about 50 nm, e.g. from about 3 nm to about 20 nm, e.g. from about 5 nm to about 15 nm.

Thus, a thickness of the layer structure 342 including the oxide layer 332 may be in a range from about 1.5 nm to about 550 nm, e.g. in a range from about 5 nm to about 20 nm.

The coupling process may take place via nucleophilic substitution. This process is visualized in FIG. 3, in which the nucleophilic substitution is shown to take place, forming a covalent bond 442 between an organic (in this case silane) molecule 338 and the nucleophilic (in this case OH) group 336 attached to the metal (in this case Al) surface 330S.

On base metals and their respective alloys (e.g. Al, Ti, Ta, Pb, Sn, Ni, NiP, Ti, Cu) and/or on semiconductor materials (e.g., Si, Ge), using the plasma 334, a nucleophilic surface can be obtained that may react with the silane function of an organic molecule 338 via the reaction scheme shown in FIG. 2, FIG. 3, and FIG. 4 (top). With usual thicknesses of 10 to 500 nm, the layer structure 342 may have corrosion barrier properties. The layer structure 342 may in addition act as an adhesion promoter via respective second functions 552 (e.g. —$NH_2$; triamine-, diamine-function; see an example in FIG. 4) of the organic molecules 338.

On precious metals (e.g. Au, Ag, Pd), i.e. in a case of the metal surface 330S being formed by a precious metal, the coupling may for example be achieved via sulfide formation or via formation of amino-complexes. As precious metals do not form hydroxyl—groups the coupling of their metal surface 330S to the amino-silane 338 or the thio-silane 338 may happen via formation of aminocomplex or metal-sulfide formation on the precious metal. A connection to a molecule 550 of an encapsulation material, e.g. an epoxy (see, e.g., FIG. 4), may then happen through a $2^{nd}$ or several other layers of silanes 338 beeing coupled to the $1^{st}$ layer via a silane-to-silane reaction. This is possible through the hydrolysis of the thriethoxysilane group with water forming free silanole groups that carry OH-nucleophils.

The following Table 2 gives an overview of some plasma process conditions to form optimum surface functional groups (e.g. nucleophilic groups 336) for organic molecule 338 (e.g. silane) coupling. In general, the plasma treatment may remove any organic contamination, and may further prepare the surface as described in the table.

| Plasma process options | Description of surface |
| --- | --- |
| $H_2$ | Metal oxides are reduced until final OH-group formation |
| $Ar/H_2$ | Metal oxides are reduced until final OH-group formation |
| $Ar/H_2/O_2$ | Metal oxides are reduced until final OH-group formation |
| $H_2/O_2$ | Metal oxides are reduced until final OH-group formation |
| $N_2/H_2$ | Metal oxides are reduced, Due to presence of $N_2$ formation of $NH_2$-terminated surface. |
| $N_2/H_2O$ | Oxide layer that hydrolyses with humidity to respective hydroxyl groups on the surface and/or additional formation of –$NH_2$ groups on the surface. |
| $NH_3$ | Ammonia gas forming –$NH_2$ groups on the surface |

In various embodiments, only one type of nucleophilic groups 336 may be formed, e.g. OH groups, $NH_2$ groups or CN groups. In various embodiments, more than one type of nucleophilic groups 336 may be formed, e.g. two or more types of nucleophilic groups 336 selected from the group including OH groups, $NH_2$ groups or CN groups. For example, as listed in the above table for the $N_2/H_2O$-plasma 334, OH groups may be formed together with $NH_2$ groups.

In various embodiments, plasmas 334 not containing hydrogen may be used for the forming of the nucleophilic groups 336. The following Table 3 gives some examples for such plasmas 334:

| Plasma process options | Description of surface |
| --- | --- |
| $Ar/O_2$ | Oxide layer that hydrolyses with humidity to respective hydroxyl groups on the surface |
| Ar/Air | Oxide layer that hydrolyses with humidity to respective hydroxyl groups on the surface and/or additional formation of –$NH_2$ groups on the surface. |
| $Ar/N_2$ | Formation of –$NH_2$ groups on the surface. |

In various embodiments, the method may further include forming the organic layer 340 covalently bonded to the nucleophilic groups 336, wherein the organic layer 340 may include at least one organic material selected from the group consisting of N-(2-Aminoethyl)-3-aminopropyltrimethoxysilane (CAS:1760-24-3), (3-Trimethoxysilylpropyl) diethylenetriamine (CAS: 35141-30-1), Cycloamin-silane 2,2-Dimethoxy-1,6-diaza-2-silacyclooctane (CAS: 182008-07-7), Aminopropyltriethoxysilane (CAS: 919-30-2), Aminopropyltrimethoxysilane (CAS: 13822-56-5), (Aminoethylaminomethyl) Phenethyltrimethoxysilane (CAS: 74113-77-2), Bis(triethoxysilylpropyl)amine (CAS: 13497-18-2), Bis(trimethoxysilylpropyl)amine CAS: 82985-35-1), N,N'-Bis(3-(trimethoxysilyl)propyl)ethylenediamine (CAS: 68845-16-9), Bis(triethoxysilyl)ethane (CAS: 16068-37-4), 3-Amino-5-mercapto-1,2,4-triazole (CAS: 16691-43-3), 3-Mercaptopropyltrimethoxysilane (CAS: 4420-74-0), and 3-Mercaptopropyltriethoxysilane (CAS: 14814-09-6).

The organic material forming the organic layer 340 may include at least one group suitable for covalent bonding to the nucleophilic groups 336. The group may in various embodiments include or consist of a tri-methoxy-silane, a tri-ethoxy-silane, or a thio group.

In various embodiments, a method of forming a layer structure may further include forming nucleophilic groups between the metal surface 330S and the oxide layer 332, thereby increasing an adhesion between the metal surface 330S and the oxide layer.

In various embodiments, a method of forming a layer structure may include plasma-treating a metal surface 330S with a hydrogen-containing plasma 334, thereby forming nucleophilic groups 336 over the metal surface 330S, and forming an organic layer 340 over the metal surface 330S, wherein the organic layer 340 includes or consists of silane and is covalently bonded to the nucleophilic groups 336.

In various embodiments, a method of forming a layer structure 342 may include forming an oxide layer 332 over a metal surface 330S by atomic layer deposition, wherein the oxide layer 332 includes nucleophilic groups 336, and forming an organic layer 340 over the oxide layer 332, wherein the organic layer 340 includes or consists of silane and is covalently bonded to the nucleophilic groups.

The forming the organic layer 340 is visualized in FIGS. 2 and 4, and the formed organic layer 340 including the organic (e.g. silane) molecules is shown in FIG. 2, FIG. 3, and FIG. 4.

In FIG. 2, the surface conditioning with plasma 334 to form hydroxides on the metal surface 330S (example: Cu) is shown. The silane function $((OH_3)—Si—R)$ of the organic molecule 338 may undergo a coupling via nucleophilic substitution with the surface OH 336. As shown in FIG. 4 (top), the coupling of the organic molecule 338, e.g. the silane, may take place as an SN1-type reaction and/or as an SN2-type reaction.

In various embodiments, an acid/base treatment may be used instead of the plasma 334 treatment for forming the OH groups 336.

In the following, Table 4 (which is also shown in FIG. 1) is presented that specifies properties of suitable organic molecules 338. Except for number 11 (which is a triazole), all organic materials shown in the table are silanes.

| No | Name | Structure | Electrophil or group for metal linkage |
|---|---|---|---|
| 1 | N-(2-Aminoethyl)-3-aminopropyltrimethoxysilane (CAS: 1760-24-3) | | Trimethoxysilane |
| 2 | (3-Trimethoxysilyl-propyl)diethylenetriamine (CAS: 35141-30-1) | | Trimethoxysilane |
| 3 | Cycloamin-silan 2,2-Dimethoxy-1,6-diaza-2-silacyclo-octane (CAS: 182008-07-7) | | Trimethoxysilane |
| 4 | Aminopropyltriethoxysilan (CAS: 919-30-2) | | Triethoxysilane |
| 5 | Aminopropyltrimethoxysilan (CAS: 13822-56-5) | | Trimethoxysilane |

-continued

| No | Name | Structure | Electrophil or group for metal linkage |
|---|---|---|---|
| 6 | (Aminoethylaminomethyl) Phenethyltrimethoxysilane (CAS: 74113-77-2) | | Trimethoxysilane |
| 7 | Bis(triethoxysilylpropyl)amine (CAS: 13497-18-2) | | Triethoxysilane |
| 8 | Bis(trimethoxysilylpropyl)amine (CAS: 82985-35-1) | | Trimethoxysilane |
| 9 | N,N'-Bis(3-(trimethoxysilyl)propyl) ethylenediamine (CAS: 68845-16-9) | | Trimethoxysilane |
| 10 | Bis(triethoxysilyl) ethane (CAS: 16068-37-4) | | Triethoxysilane |
| 11 | 3-Amino-5-mercapto-1,2,4-triazole (CAS: 16691-43-3) | | Thio |
| 12 | 3-Mercaptopropyltrimethoxysilane (CAS: 4420-74-0) | | Trimethoxysilane |

-continued

| No | Name | Structure | Electrophil or group for metal linkage |
|----|------|-----------|----------------------------------------|
| 13 | 3-Mercaptopropyl-triethoxysilane (CAS: 14814-09-6) | H₃C-O, H₃C-O-Si-SH, H₃C-O | Tri-ethoxy-silane |

The table lists organic (mostly silane) adhesion promoter molecules that at the same time generate also a corrosion barrier, thus bifunctional organic molecules. Basically all of these molecules can be applied with either an ethoxy— substituent at the silicon or a methoxy group. Further molecules may be possible that are utilizing a phenoxy or toluoxy-group at the silicon side instead of an ethoxy or methoxy group. This may provide an additional advantage, since the aromatic substitution groups may offer a detection of the unsubstituted species via UV spectroscopy. Besides these substituents any other aromatic functional group (side-chain) may be used, some of which may even allow a detectability of such molecules in the visible light. With this approach, the functionality of surface coupling reaction may be made visible in terms of a process control.

The organic layer 340 may in various embodiments be formed by dipping the metal surface 330S into a solution containing the organic molecules 338, spray depositing the organic molecules 338 (or rather a solution thereof), gas phase depositing the organic molecules 338, and/or plasma depositing the organic molecules 338.

The organic molecules 338 may have a specific vapour pressure and therefore may be sublimed at specific conditions. The deposition conditions are further described in the following Table 5:

| Version | Spray deposition | Dipping | Vapour phase deposition | Plasma Deposition |
|---------|------------------|---------|-------------------------|-------------------|
| Silane | Solution in ethanol/water | Solution in ethanol/water | Pure | Bubbling with Ar or N2 |
| Pressure | Ambient | Ambient | Vacuum | Ambient |
| Temperature | RT up to 80° C. | RT up to 80° C. | RT up to 150° C. | RT up to 80° C. |
| Silane Concentration | 1-250 mmol/l Solution | 1-250 mmol/l Solution | NA | NA |

Positive experimental results may also be obtained from mixtures of two molecules included in the table of molecules 338.

In various embodiments, the organic molecules 338 may be cross-linked with each other by a link 334, thereby further increasing at least the barrier function of the organic layer 340.

In various embodiments, the forming the layer structure 342 may further include forming an encapsulation layer over the organic layer 340. The encapsulation layer is not shown completely in the figures, but a molecule 550 (e.g. a biphenyl epoxy resin) of an encapsulation material and how it is bonded (e.g. through a covalent bond 554) to a functional group 552 of the organic layer 340 is visualized in FIG. 4.

The encapsulation layer may be arranged to at least partially, e.g. essentially completely, except for external contact structures, encapsulate the device, in particular the metal surface.

The encapsulation material may include or consist of a typically used encapsulation material, e.g. a mold compound, e.g. a resin, e.g. an epoxy resin.

In various embodiments, the encapsulated device may be a chip package. Thus, a method of forming a chip package may be provided. The method may include forming a layer structure using the method as described above in accordance with various embodiments, before or after the forming the nucleophilic groups, electrically conductively connecting the chip to the metal surface of the layer structure, and arranging an encapsulation material at least partially encapsulating the chip and the layer structure, wherein the packaging material is covalently bonded to the organic (e.g. silane) layer that is part of the layer structure.

In various embodiments, the forming the organic layer 340 may include, after the forming the nucleophilic groups 336, arranging a liquid encapsulation material, in which an organic material (e.g., the organic molecules 338, e.g. the silanes) for forming the organic layer may be dispersed, over the metal surface 330S and in contact with the nucleophilic groups, thereby forming the organic layer 340 and an encapsulation layer over the organic layer 340.

FIG. 6A to FIG. 6D show test results of a measured shear force for layer structures in accordance with various embodiments. Other layer structures were tested for comparison purposes. In all the panels 700 to 703, a higher shear force is indicative for a better adhesion. For each of the surface treatments (or possibly non-treatments in the case of a comparison sample), the shear force was determined under four different test conditions: initial, after 3× reflow at 260° C., after storage in an autoclave at 121° C. for 192 hours, and after high temperature storage for 1000 hours.

Figure 6A:
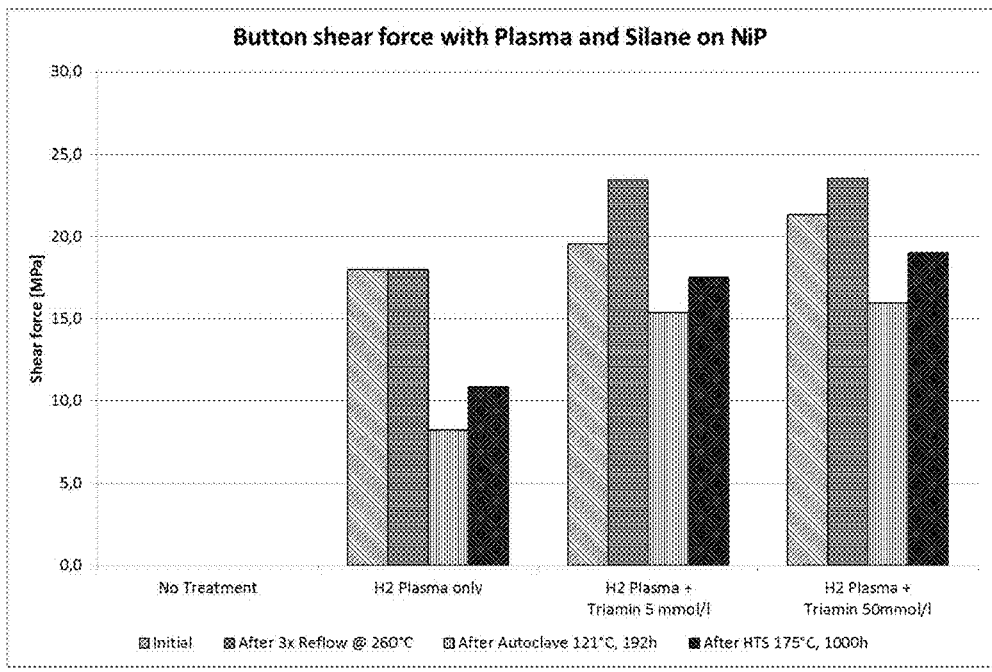
FIG. 6A to FIG. 6D show test results of a measured shear force for layer structures in accordance with various embodiments and other layer structures.

As can be seen in FIG. 6A, the button shear force is increased with respect to an untreated NiP surface for both, the (H₂-)plasma treated surface, and the (H₂-)plasma treatment combined with (3-Trimethoxysilylpropyl) diethylenetriamine (abbreviated as "Triamin") at two different concentrations. Here, either the initial shear force or the shear force after the reflow is highest, and the shear force after the autoclave is lowest when comparing the four different test conditions for a given surface treatment.

Figure 6B:
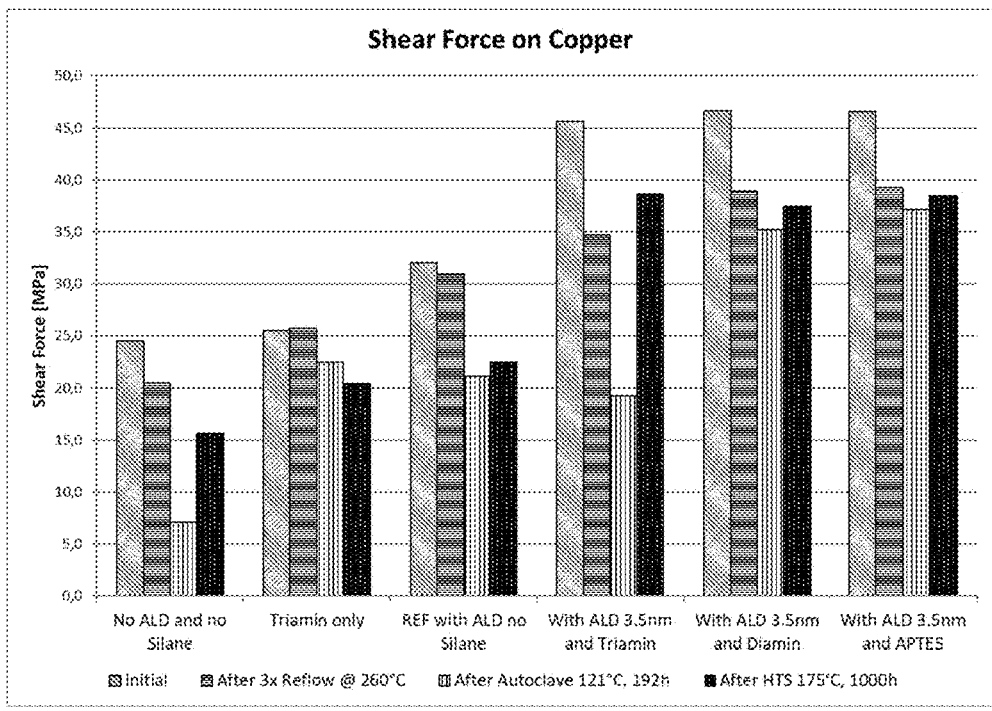

For the test results shown in FIG. 6B, a copper surface was used as the metal surface 330S. On the copper surface, a native oxide layer 332 is expected to have formed, which may include OH-groups on approximately a quarter of its surface (see Table 1). The layer structure formed without atomic layer deposition and without silane may be considered a reference example. The embodiments using the (3-Trimethoxysilylpropyl) diethylenetriamine (abbreviated as "Triamin") and with atomic layer deposition (ALD) of an oxide layer 332, respectively, already show a slightly increased shear force over the reference examples, at least with respect to the test condition "initial". All embodiments show an increase in the shear force over the untreated ("no ALD, no silane") The combination of ALD and N,N'-Bis (3-(trimethoxysilyl)propyl)ethylenediamine (abbreviated as "Diamin") and the combination of ALD and Aminopropyltriethoxysilan (abbreviated as APTES) show the highest shear force values.

Figure 6C:
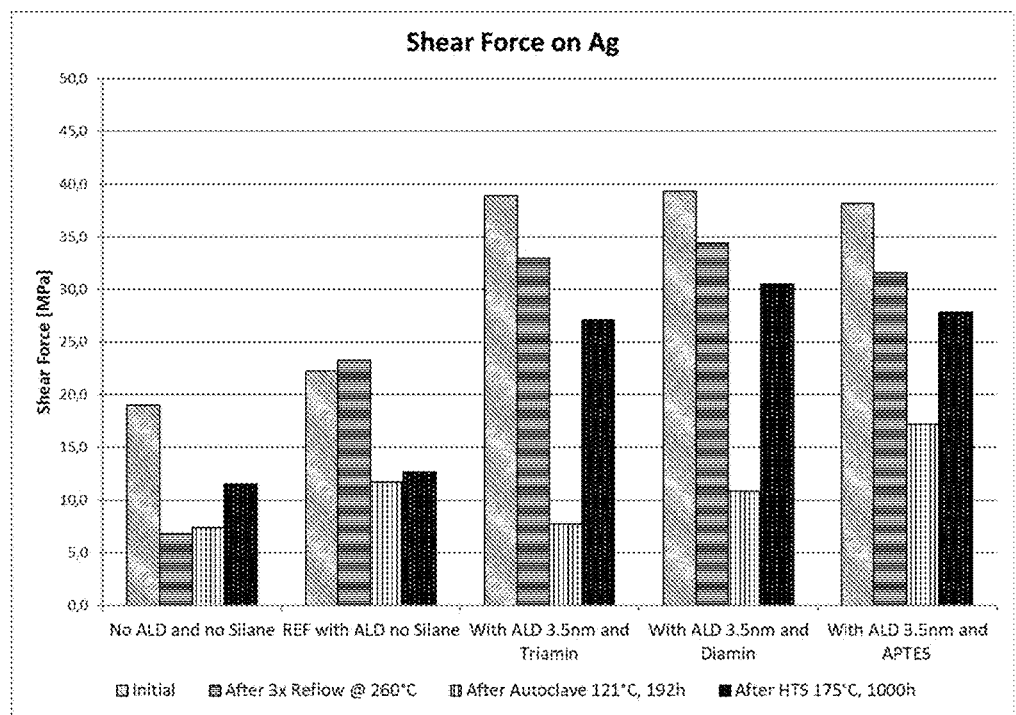

For the shear force tests shown in FIG. 6C, the same layer structures 342 (except for the "Triamin only") as in FIG. 6B were formed, but on a silver surface as the metal surface 330S. No native oxide is expected to have formed on the silver surface (see Table 1). The layer structure formed without atomic layer deposition and without silane may be considered a reference example. The embodiment with atomic layer deposition (ALD) of an oxide layer 332, but without silane, already shows a slightly increased shear force at least over the no-ALD-no-silane reference example. All embodiments show an increase in the shear force over the untreated ("no ALD, no silane") layer structureThe combination of ALD and Aminopropyltriethoxysilan (abbreviated as APTES) shows the highest shear force values of the embodiments after the autoclave treatment. Otherwise, the three embodiments with the ALD deposition and the organic layer show rather similar shear force values.

Figure 6D:
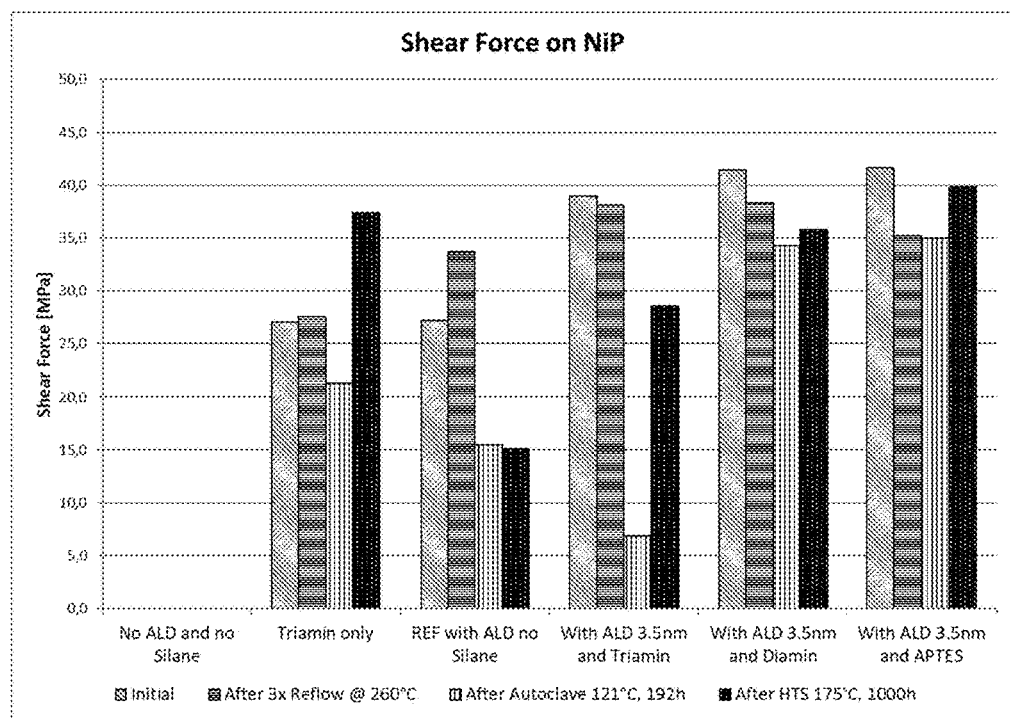

For the shear force tests shown in FIG. 6D, the same layer structures 342 as in FIG. 6B were formed, but on a NiP surface as the metal surface 330S. Even though a native oxide layer 332 is expected to have formed, and approximately a quarter of the surface (see Table 1) is expected to be covered with nucleophilic OH groups, it is notoriously difficult to form an adhesive connection between a NiP surface and an encapsulation material, which is shown in the zero-values for the "no ALD and no silane" case. The layer structure formed without atomic layer deposition and without silane may be considered a reference example. Considering the zero shear force values for the untreated case, all embodiments show a vast increase of shear force over the untreated reference for alltest conditions. The combination of ALD and N,N'-Bis(3-(trimethoxysilyl)propyl)ethylenediamine (abbreviated as "Diamin") and the combination of ALD and Aminopropyltriethoxysilan (abbreviated as APTES) show the highest overall shear force values of the embodiments after the autoclave treatment.

Figure 7:
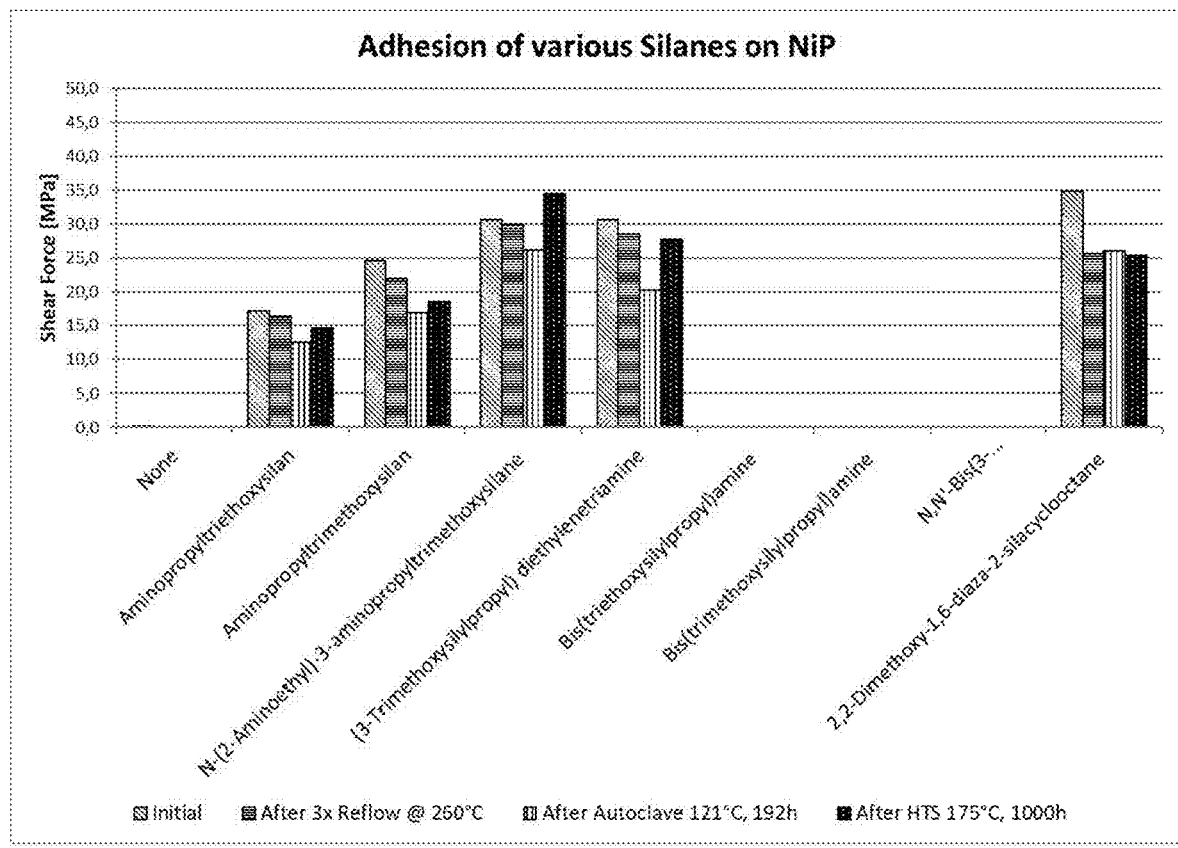
FIG. 7 shows test results of a measured shear force for layer structures in accordance with various embodiments in comparison with an untreated sample.

FIG. 7 shows test results of a measured shear force for layer structures 342 formed on a NiP surface as the metal surface 330S in accordance with various embodiments. The measurements are shown in comparison with an untreated sample, labelled as "None". Measurements are provided, similar to FIG. 6A to FIG. 6D, for four different test conditions (initial, after 3× reflow at 260° C., after storage in an autoclave at 121° C. for 192 hours, and after high temperature storage for 1000 hours). As can be seen from the results, the organic molecules (silanes) providing the best adhesion (the highest shear force), averaged for all four test conditions, are N-(2-Aminoethyl)-3-aminopropyltrimethoxysilane, 2,2-Dimethoxy-1,6-diaza-2-silacyclooctane and (3-Trimethoxysilylpropyl) diethylenetriamine. They are followed by aminopropyltrimethoxysilane and aminopropyltriethoxysilane, respectively.

Figure 8:
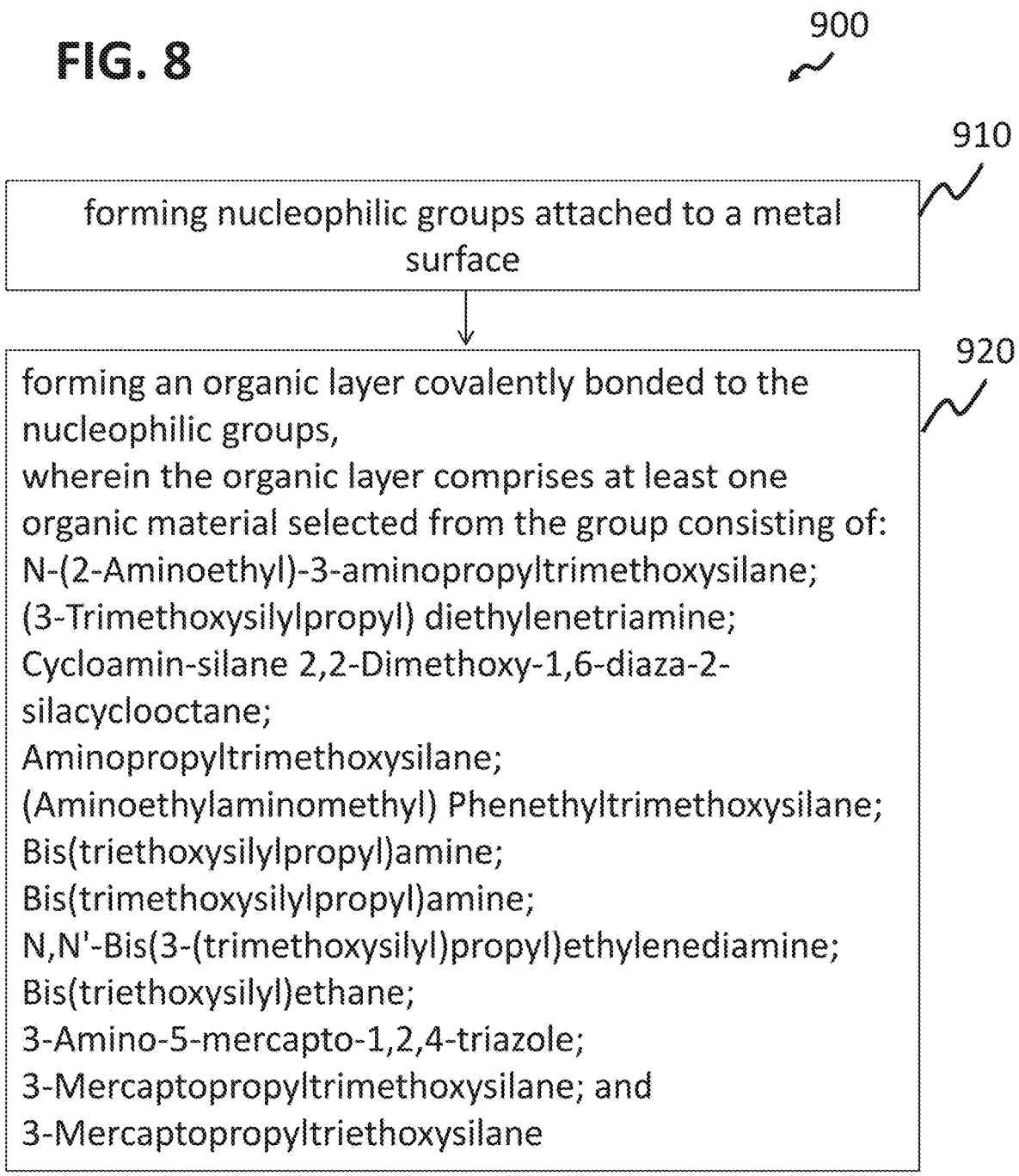
FIG. 8 shows a flow diagram of a method of forming a layer structure in accordance with various embodiments.

FIG. 8 shows a flow diagram 900 of a method of forming a layer structure in accordance with various embodiments.

The method may include forming nucleophilic groups attached to a metal surface (in 910), and forming an organic layer covalently bonded to the nucleophilic groups, wherein the organic layer includes at least one organic material selected from the group consisting of: N-(2-Aminoethyl)-3-aminopropyltrimethoxysilane, (3-Trimethoxysilylpropyl) diethylenetriamine, Cycloamin-silane 2,2-Dimethoxy-1,6-diaza-2-silacyclooctane, Aminopropyltrimethoxysilane, (Aminoethylaminomethyl) Phenethyltrimethoxysilane, Bis (triethoxysilylpropyl)amine, Bis(trimethoxysilylpropyl)amine, N,N'-Bis(3-(trimethoxysilyl)propyl)ethylenediamine, Bis(triethoxysilyl)ethane, 3-Amino-5-mercapto-1,2,4-triazole, 3-Mercaptopropyltrimethoxysilane, and 3-Mercaptopropyltriethoxysilane (in 920).

Figure 9:
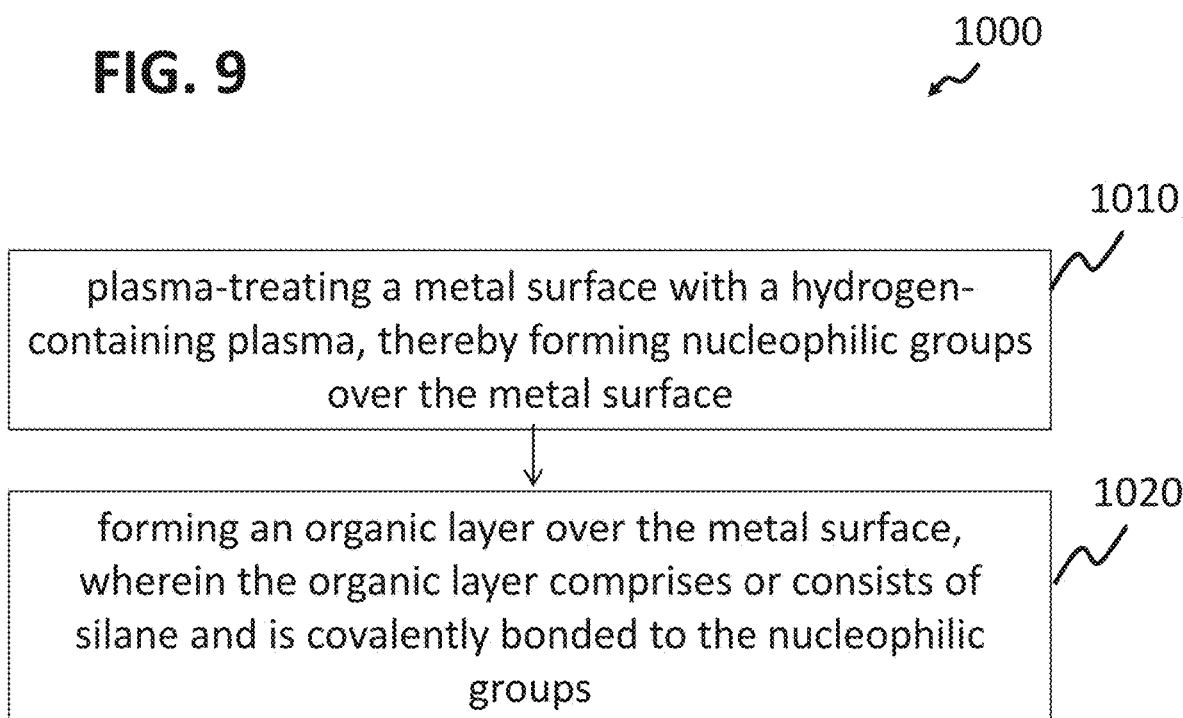
FIG. 9 shows a flow diagram of a method of forming a layer structure in accordance with various embodiments.

FIG. 9 shows a flow diagram 1000 of a method of forming a layer structure in accordance with various embodiments.

The method may include plasma-treating a metal surface with a hydrogen-containing plasma, thereby forming nucleophilic groups over the metal surface (in 1010), and forming an organic layer over the metal surface, wherein the organic layer includes or consists of silane and is covalently bonded to the nucleophilic groups (in 1020).

Figure 10:
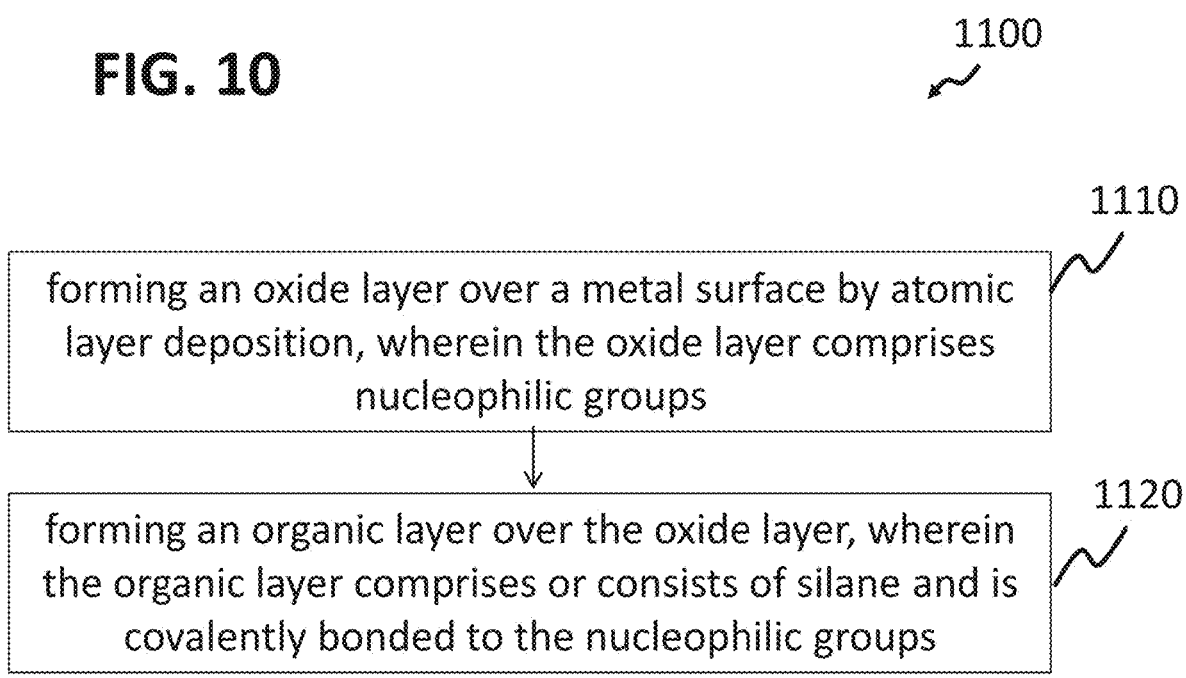
FIG. 10 shows a flow diagram of a method of forming a layer structure in accordance with various embodiments.

FIG. 10 shows a flow diagram 1100 of a method of forming a layer structure in accordance with various embodiments.

The method may include forming an oxide layer over a metal surface by atomic layer deposition, wherein the oxide layer includes nucleophilic groups (in 1110), and forming an organic layer over the oxide layer, wherein the organic layer includes or consists of silane and is covalently bonded to the nucleophilic groups (in 1120).

In various embodiments, to achieve both functions, the adhesion promotion and the corrosion barrier in a layer structure, e.g. a layer structure of a contact structure, which may be part of a chip package, several possible ways (Case A to Case D) are provided.

Case A) Combination of plasma conditioning (details see Tables 2 and 3) and a layer formed from specific bifunctional silane molecules (details see Table 4) on the device surfaces (which may at least include a metal surface). The adhesion promotion may already be achieved with thin layers of 1 to 10 nm, however, additional barrier properties are only achieved with thicker layers >10 nm up to 500 nm, depending on the bifunctional molecule.

Case B) Combination of an atomic layer deposited (ALD) aluminum oxide (or other oxide) layer and a specific bifunctional organic (e.g. silane or triazole) layer (details Table 4) on the device surface (which may at least include a metal surface). With this approach, the organic layer thickness can be reduced (down to about one monolayer, which may have a thickness of about 0.5 nm), because the barrier function may be provided by the $Al_2O_3$.

Case C) ALD alone may act as an adhesion promoter, because $Al_2O_3$ may form a nucleophilic surface function, especially together with (optional) specific plasma conditioning for surface activation. The bifunctional silane molecules for the linkage here may be delivered intrinsically by the used polymer, e.g. the molecules from Table 4 may be mixed into the resin.

Case D) Options A and B may be combined and the ALD (aluminum-)oxide surface may be further treated with respective plasma conditions right before the silane deposition, such that the amount of surface OH groups may be further optimized. As a consequence, the reaction surface yield may be optimized.

In various embodiments the ALD (aluminiumoxide) layer, together with the optimum formed poly-organic siloxane layer, may form a corrosion barrier for specific corrosive species such as $H_2O$, $O_2$, halogenides, $H_2S$, organic sulfur (thiols, ect).

The layer structure may be integrated, for example in a package, e.g. a chip package. The adhesion/barrier layer structure may be applied at the following positions/points in time during package assembly:

a) On a bare leadframe
b) After diebonding, before wirebonding
c) After wirebonding, before molding.

Other examples may have different integration options, such as a usage as adhesion promoter for polyimide adhesion.

Various examples will be illustrated in the following:

Example 1 is a method of forming a layer structure. The method may include forming nucleophilic groups attached to a metal surface, and forming an organic layer covalently bonded to the nucleophilic groups, wherein the organic layer includes at least one organic material selected from the group consisting of N-(2-Aminoethyl)-3-aminopropyltrimethoxysilane, (3-Trimethoxysilylpropyl) diethylenetriamine, Cycloamin-silane 2,2-Dimethoxy-1,6-diaza-2-silacyclooctane, Aminopropyltrimethoxysilane, (Aminoethylaminomethyl) Phenethyltrimethoxysilane, Bis(triethoxysilylpropyl)amine, Bis(trimethoxysilylpropyl)amine, N,N'-Bis(3-(trimethoxysilyl)propyl)ethylenediamine, Bis(triethoxysilyl)ethane, 3-Amino-5-mercapto-1,2,4-triazole, 3-Mercaptopropyltrimethoxysilane, and 3-Mercaptopropyltriethoxysilane.

In Example 2, the subject-matter of Example 1 may optionally include that the forming the nucleophilic groups includes plasma treating the metal surface.

Example 3 is a method of forming a layer structure. The method may include plasma-treating a metal surface with a hydrogen-containing plasma, thereby forming nucleophilic groups over the metal surface, and forming an organic layer over the metal surface, wherein the organic layer includes or consists of silane and is covalently bonded to the nucleophilic groups.

Example 4 is a method of forming a layer structure. The method may include forming an oxide layer over a metal surface by atomic layer deposition, wherein the oxide layer includes nucleophilic groups, and forming an organic layer over the oxide layer, wherein the organic layer includes or consists of silane and is covalently bonded to the nucleophilic groups.

In Example 5, the subject-matter of Example 4 may optionally further include plasma-treating the oxide layer with a hydrogen-containing plasma, wherein at least a portion of the nucleophilic groups is formed by the plasma treatment.

In Example 6, the subject-matter of any of Examples 2 to 5 may optionally include that the plasma includes at least one plasma selected from the group including $Ar/H_2$, $Ar/H_2/O_2$, $H_2/O_2$, $N_2/H_2O$, $NH_3$, and $H_2$.

In Example 7, the subject-matter of any of Examples 1 to 6 may optionally include that the nucleophilic groups include or consist of —OH-groups, —$NH_2$-groups and/or —CN-groups.

In Example 8, the subject-matter of any of Examples 1 to 7 may optionally include that the forming the organic layer comprises dipping in a solution, spray depositing, gas phase depositing, and/or plasma depositing.

In Example 9, the subject-matter of any of Examples 1 to 8 may optionally include forming an encapsulation layer over the organic layer.

In Example 10, the subject-matter of any of Examples 1 to 7 may optionally include that the forming the organic layer includes, after the forming the nucleophilic groups, arranging a liquid encapsulation material, in which an organic material for forming the organic layer is dispersed, over the metal surface and in contact with the nucleophilic groups, thereby forming the organic layer and an encapsulation layer over the organic layer.

In Example 11, the subject-matter of any of Examples 1 to 10 may optionally include that the metal surface and a non-metal surface form a common outer surface, and that the nucleophilic groups include a first portion of nucleophilic groups attached to the metal surface that is formed simultaneously with a second portion of nucleophilic groups attached to the non-metal surface.

Example 12 is a method of forming a contact structure. The method may include forming a layer structure using the method of any of Examples 1 to 11, and, before or after the forming the nucleophilic groups, forming an electrical contact to the metal surface.

Example 13 is a method of forming a chip package. The method may include forming a layer structure using the method of any of Examples 1 to 11, before or after the forming the nucleophilic groups, electrically conductively connecting the chip to the metal surface of the layer structure, and arranging an encapsulation material at least partially encapsulating the chip and the layer structure, wherein the packaging material is covalently bonded to the silane layer.

Example 14 is a layer structure. The layer structure may include a metal surface, nucleophilic groups attached to the metal surface, and an organic layer covalently bonded to the nucleophilic groups, wherein the organic layer includes at least one organic material selected from the group consisting of N-(2-Aminoethyl)-3-aminopropyltrimethoxysilane, (3-Trimethoxysilylpropyl) diethylenetriamine, Cycloamin-silane 2,2-Dimethoxy-1,6-diaza-2-silacyclooctane, Aminopropyltrimethoxysilane, (Aminoethylaminomethyl) Phenethyltrimethoxysilane, Bis(triethoxysilylpropyl)amine, Bis(trimethoxysilylpropyl)amine, N,N'-Bis(3-(trimethoxysilyl)propyl)ethylenediamine, Bis(triethoxysilyl)ethane, 3-Amino-5-mercapto-1,2,4-triazole, 3-Mercaptopropyltrimethoxysilane, and 3-Mercaptopropyltriethoxysilane.

Example 15 is a layer structure. The layer structure may include a metal surface, an oxide layer formed on the metal surface by atomic layer deposition, wherein the oxide layer includes nucleophilic groups, and an organic layer formed on the oxide layer, wherein the organic layer includes or consists of silane and is covalently bonded to the nucleophilic groups.

In Example 16, the subject-matter of Example 15 may optionally include that at least a portion of the nucleophilic groups is formed by a plasma treatment with a hydrogen containing plasma.

In Example 17, the subject-matter of Example 15 or 16 may optionally include that the oxide layer is an inorganic oxide layer.

In Example 18, the subject-matter of Example 16 or 17 may optionally include that the oxide layer includes at least one oxide selected from the group consisting of aluminum oxide, silicon oxide, hafnium oxide, titanium oxide, zirconium oxide, and mixtures thereof.

In Example 19, the subject-matter of any of Examples 16 to 18 may optionally include that the silane includes ethoxy groups or methoxy groups by which it is covalently bonded to the nucleophilic groups.

In Example 20, the subject-matter of any of Examples 15 to 19 may optionally include that the silane is selected from the group consisting of N-(2-Aminoethyl)-3-aminopropyltrimethoxysilane, (3-Trimethoxysilylpropyl) diethylenetriamine, Cycloamin-silane 2,2-Dimethoxy-1,6-diaza-2-silacyclooctane, Aminopropyltrimethoxysilane, (Aminoethylaminomethyl) Phenethyltrimethoxysilane, Bis(triethoxysilylpropyl)amine, Bis(trimethoxysilylpropyl)amine, N,N'-Bis(3-(trimethoxysilyl)propyl)ethylenediamine, Bis(triethoxysilyl)ethane, 3-Mercaptopropyltrimethoxysilane, and 3-Mercaptopropyltriethoxysilane.

In Example 21, the subject-matter of any of Examples 15 to 20 may optionally include that a metal forming the metal surface includes at least one metal selected from the group consisting of gold, nickel, nickel-phosphorus, copper, palladium, aluminum, titanium, tin, lead, tantal, germanium, silver, and alloys thereof.

Example 22 is a chip package. The chip package may include a chip, the layer structure of any of Examples 15 to 21, wherein the chip is electrically conductively connected to the metal surface of the layer structure, and an encapsulation material at least partially encapsulating the chip and the layer structure, wherein the packaging material is covalently bonded to the silane layer.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method, comprising:
   forming nucleophilic groups attached to a metal surface;
   forming an organic layer covalently bonded to the nucleophilic groups,
   wherein the organic layer comprises at least one organic material selected from the group consisting of:
   N-(2-Aminoethyl)-3-aminopropyltrimethoxysilane;
   (3-Trimethoxysilylpropyl) diethylenetriamine;
   Cycloamin-silane 2,2-Dimethoxy-1,6-diaza-2-silacyclooctane;
   Aminopropyltrimethoxysilane;
   (Aminoethylaminomethyl) Phenethyltrimethoxysilane;
   Bis(triethoxysilylpropyl)amine;
   Bis(trimethoxysilylpropyl)amine;
   N,N'-Bis(3-(trimethoxysilyl)propyl)ethylenediamine;
   Bis(triethoxysilyl)ethane;
   3-Amino-5-mercapto-1,2,4-triazole;
   3-Mercaptopropyltrimethoxysilane; and
   3-Mercaptopropyltriethoxysilane,
   wherein the forming the organic layer comprises:
   after the forming the nucleophilic groups, arranging a liquid encapsulation material, in which an organic material for forming the organic layer is dispersed, over the metal surface and in contact with the nucleophilic groups, to form the organic layer and an encapsulation layer over the organic layer.

2. The method of claim 1, wherein the forming the nucleophilic groups comprises plasma treating the metal surface.

3. The method of claim 2, wherein the plasma comprises at least one plasma selected from the group consisting of:
   $Ar/H_2$;
   $Ar/H_2/O_2$;
   $H_2/O_2$;
   $N_2/H_2O$;
   $NH_3$; and
   $H_2$.

4. The method of claim 1, wherein the nucleophilic groups comprise —OH-groups, —$NH_2$-groups and/or —CN-groups.

5. The method of claim 1, wherein the forming the organic layer comprises dipping in a solution, spray depositing, gas phase depositing, and/or plasma depositing.

6. The method of claim 1, wherein the metal surface and a non-metal surface form a common outer surface, wherein the nucleophilic groups comprise a first portion of nucleophilic groups attached to the metal surface that is formed simultaneously with a second portion of nucleophilic groups attached to the non-metal surface.

7. The method of claim 1, further comprising:
   forming a layer structure that includes the organic layer; and
   before or after forming the nucleophilic groups, forming an electrical contact to the metal surface.

8. The method of claim 7, further comprising:
   electrically connecting a chip to the metal surface of the layer structure; and
   arranging an encapsulation material at least partially encapsulating the chip and the layer structure, wherein the encapsulation material is covalently bonded to the organic layer.

9. A method, comprising:
   plasma-treating a metal surface with a hydrogen-containing plasma to form nucleophilic groups over the metal surface; and
   forming an organic layer over the metal surface, wherein the organic layer comprises silane and is covalently bonded to the nucleophilic groups,
   wherein the forming the organic layer comprises:
   after the forming the nucleophilic groups, arranging a liquid encapsulation material, in which an organic material for forming the organic layer is dispersed, over the metal surface and in contact with the nucleophilic groups, to form the organic layer and an encapsulation layer over the organic layer.

10. The method of claim 9, wherein the hydrogen-containing plasma comprises at least one plasma selected from the group consisting of:
    $Ar/H_2$;
    $Ar/H_2/O_2$;
    $H_2/O_2$;
    $N_2/H_2O$;
    $NH_3$; and
    $H_2$.

11. The method of claim 9, wherein the nucleophilic groups comprise —OH-groups, —$NH_2$-groups and/or —CN-groups.

12. The method of claim 9, wherein the forming the organic layer comprises dipping in a solution, spray depositing, gas phase depositing, and/or plasma depositing.

13. The method of claim 9, wherein the metal surface and a non-metal surface form a common outer surface, wherein the nucleophilic groups comprise a first portion of nucleophilic groups attached to the metal surface that is formed simultaneously with a second portion of nucleophilic groups attached to the non-metal surface.

14. The method of claim 9, further comprising:
forming a layer structure that includes the organic layer; and
before or after forming the nucleophilic groups, forming an electrical contact to the metal surface.

15. The method of claim 14, further comprising:
electrically connecting a chip to the metal surface of the layer structure; and
arranging an encapsulation material at least partially encapsulating the chip and the layer structure, wherein the encapsulation material is covalently bonded to the organic layer.

* * * * *